United States Patent
Yang et al.

(10) Patent No.: US 7,283,000 B2
(45) Date of Patent: Oct. 16, 2007

(54) AUTO-ADJUSTING HIGH ACCURACY OSCILLATOR

(75) Inventors: Chih Wei Yang, Hsinchu (TW); Chien Hsun Lee, Hsinchu (TW); Hsiang Sheng Liu, Zhubei (TW); Quan Xing Huang, Taoyuan (TW)

(73) Assignee: Holtek Semiconductor, Hsinchu (TW)

( * ) Notice: Subject to any disclaimer, the term of this patent is extended or adjusted under 35 U.S.C. 154(b) by 36 days.

(21) Appl. No.: 11/291,841

(22) Filed: Dec. 2, 2005

(65) Prior Publication Data
US 2007/0090883 A1 Apr. 26, 2007

(30) Foreign Application Priority Data
Oct. 25, 2005 (TW) ............................... 94137284 A

(51) Int. Cl.
*H03L 7/085* (2006.01)
(52) U.S. Cl. ..................... 331/1 A; 331/17; 331/16
(58) Field of Classification Search ............... 331/1 A, 331/16, 17; 375/376
See application file for complete search history.

(56) References Cited

U.S. PATENT DOCUMENTS

| | | | |
|---|---|---|---|
| 5,495,205 A * | 2/1996 | Parker et al. ............... | 331/1 A |
| 5,511,100 A * | 4/1996 | Lundberg et al. ........... | 375/376 |
| 6,297,705 B1 | 10/2001 | Williams et al. ............. | 331/44 |
| 6,407,641 B1 | 6/2002 | Williams et al. ............ | 331/1 A |
| 6,771,726 B2 | 8/2004 | Pomet ......................... | 375/362 |
| 2003/0227334 A1 | 12/2003 | Chuang et al. ............... | 331/74 |
| 2004/0148539 A1 | 7/2004 | Leydler et al. ............. | 713/500 |

* cited by examiner

*Primary Examiner*—Joseph Chang
(74) *Attorney, Agent, or Firm*—Troxell Law Office, PLLC

(57) ABSTRACT

An auto-adjusting high accuracy oscillator is disclosed, which includes: a frequency comparator, for comparing a synchronization signal obtained from a USB host with an oscillation signal obtain from a device; a control tuning circuit, further comprising a counter and an adder/sub circuit; and an oscillating element; wherein a variation is obtained by the counting of the counter while transmitting the variation to the adder/sub circuit to be encoded thereby into a digital code so as to enable the oscillating element to perform a frequency up/down operation accordingly for approaching the synchronization signal successively.

4 Claims, 7 Drawing Sheets

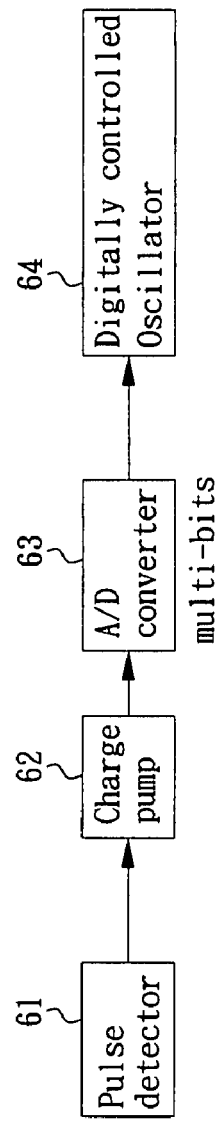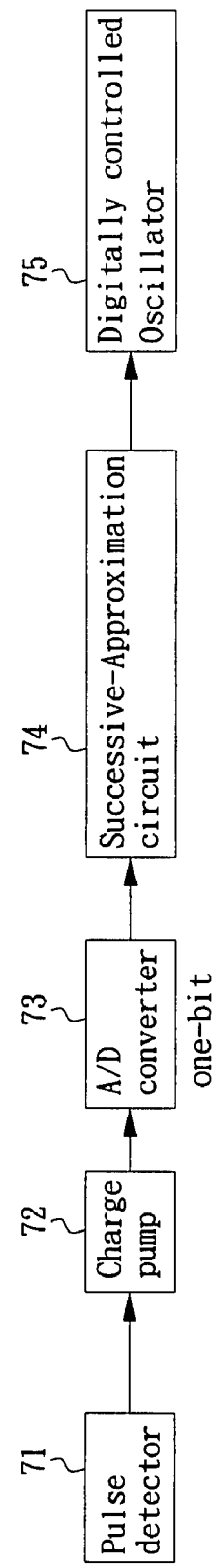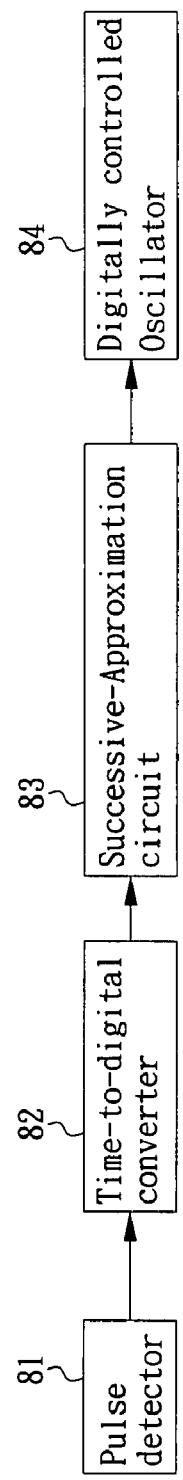
FIG. 7A
FIG. 7B
FIG. 7C

AUTO-ADJUSTING HIGH ACCURACY OSCILLATOR

FIELD OF THE INVENTION

The present invention relates to an auto-adjusting high accuracy oscillator, and more particularly, to an auto-adjusting oscillator for an universal-serial-bus (USB) interface that is capable of matching an internal clock to a data stream inputted from the USB interface by approaching the difference between two to be within 1% error rate, whereas the auto-adjusting oscillator is an internal non-quartz oscillator so that it is a compact and cost-saving device with auto-adjusting mechanism capable of being adapted for any specifications of USB protocol.

BACKGROUND OF THE INVENTION

It is known that the use of an auto-adjusting oscillator is to synchronize an internal clock to the data rate of an USB interface for ensuring data to be transmitted accurately and stably. Conventional approaches for matching an internal clock to an incoming data stream, such as Phase Lock Loops (PLL) and/Delay Lock Loops (DLL), are not appropriate to be used for locking a data stream inputted from an USB interface by the following reasons:

(1) Such conventional approaches, e.g. PLL and DLL, typically require a continuous stream of input reference clocks to match the data rate of incoming data, however, such continuous stream is not available in data communication systems using USB interface.

(2) Such conventional approaches, e.g. PLL and DLL, typically require a very long data training sequence, however, such a long data training sequence will require a long locking time that is not suitable for USB.

(3) Such conventional approaches, e.g. PLL and DLL, typically require a precision timing component for preventing timing error, however, such precision timing component is usually not available in USB applications.

From the above description, it is clear that those conventional approaches, such as PLL and DLL, are not suitable to be applied in USB applications.

SUMMARY OF THE INVENTION

In view of the disadvantages of prior art, the primary object of the present invention is to provide an auto-adjusting high accuracy oscillator for an universal-serial-bus (USB) interface that is capable of matching an internal clock to a data stream inputted from the USB interface by approaching the difference between two to be within 1% error rate, whereas the auto-adjusting oscillator is an internal non-crystal oscillator so that it is a compact and cost-saving device with auto-adjusting mechanism capable of being adapted for any specifications of USB protocol, such as USB 1.1 and USB 2.0, etc.

It is another object of the invention to provide an auto-adjusting high accuracy oscillator with internal feedback circuit for detecting and calibrating oscillating frequency, in which a detection circuit is used for automatically detecting the frequency difference between an USB signal and an oscillating frequency generated from an oscillator while calibrating and approaching the oscillating frequency to be within 1% error rate of the USB signal by a means of successive-approximation.

To achieve the above objects, the present invention provides an auto-adjusting high accuracy oscillator, comprising:

a frequency comparator, for comparing a synchronization signal obtained from a USB host with an oscillation signal obtain from a device so as to obtain a frequency difference between the two;

a control tuning circuit, further comprising a counter and an adder/sub circuit, for receiving the frequency difference received form the frequency comparator and using the same as an adjusting reference; and an oscillating element;

wherein, a variation is obtained by the counting of the counter while transmitting the variation and the adjusting reference to the adder/sub circuit to be encoded thereby into a digital code so as to enable the oscillating element to perform a frequency up/down operation according to the digital code, and thus enable the frequency of the oscillation signal to approach that of the synchronization signal successively.

Further, to achieve the above objects, the present invention provides an auto-adjusting high accuracy oscillator, comprising:

a frequency comparator, for comparing a synchronization signal obtained from a USB host with an oscillation signal obtain from a device so as to obtain a frequency difference between the two;

a control tuning circuit, further comprising a charge pump and an analog/digital (A/D) converter, capable of generating a digital code encoded in response to the frequency difference; and an oscillating element;

wherein, the oscillating element is enabled to perform a frequency up/down operation with respect to the digital code so as to enable the frequency of the oscillation signal to approach that of the synchronization signal successively.

Yet, to achieve the above objects, the present invention further provides an auto-adjusting high accuracy oscillator, comprising:

a frequency comparator, for comparing a synchronization signal obtained from a USB host with an oscillation signal obtain from a device so as to obtain a frequency difference between the two;

a control tuning circuit, further comprising a time-to-digital circuit, capable of generating a digital code encoded in response to the frequency difference; and an oscillating element;

wherein, the oscillating element is enabled to perform a frequency up/down operation with respect to the digital code so as to enable the frequency of the oscillation signal to approach that of the synchronization signal successively.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 7A is a schematic diagram illustrating the functional blocks of an auto-adjusting high accuracy oscillator according to a fifth embodiment of the present invention.

FIG. 7B is a schematic diagram illustrating the functional blocks of an auto-adjusting high accuracy oscillator according to a sixth embodiment of the present invention.

FIG. 7C is a schematic diagram illustrating the functional blocks of an auto-adjusting high accuracy oscillator according to a seventh embodiment of the present invention.

DESCRIPTION OF THE PREFERRED EMBODIMENT

For your esteemed members of reviewing committee to further understand and recognize the fulfilled functions and structural characteristics of the invention, several preferable embodiments cooperating with detailed description are presented as the follows.

It is preferred to activate an auto-adjusting circuit for adjusting an oscillating element to match an internal clock to a data stream inputted from an USB interface as soon as a complete 1 bit rate of a synchronization signal is obtained while the synchronization signal is being inputted from the USB interface, so that the data transmission can be synchronized and thus the accuracy of data to be received can be enhanced. The synchronization signal is referred as SYNC signal hereinafter.

Figure 1:
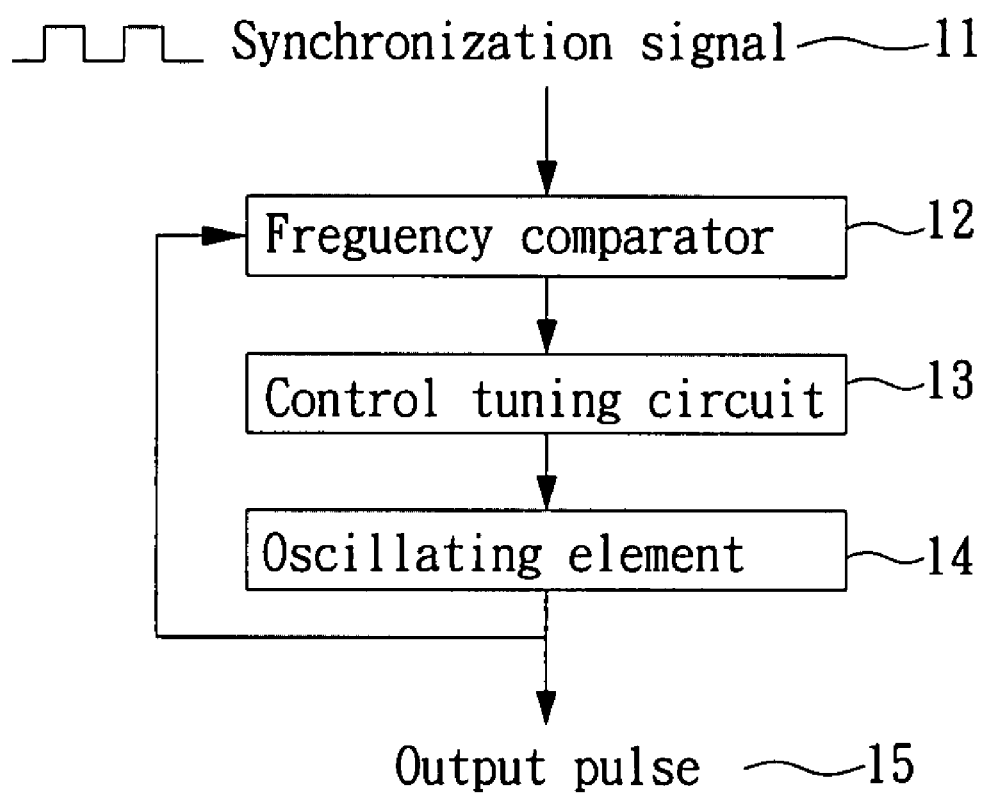
FIG. 1 is a schematic diagram illustrating the functional blocks of an auto-adjusting high accuracy oscillator according to a first embodiment of the present invention.
Figure 2:
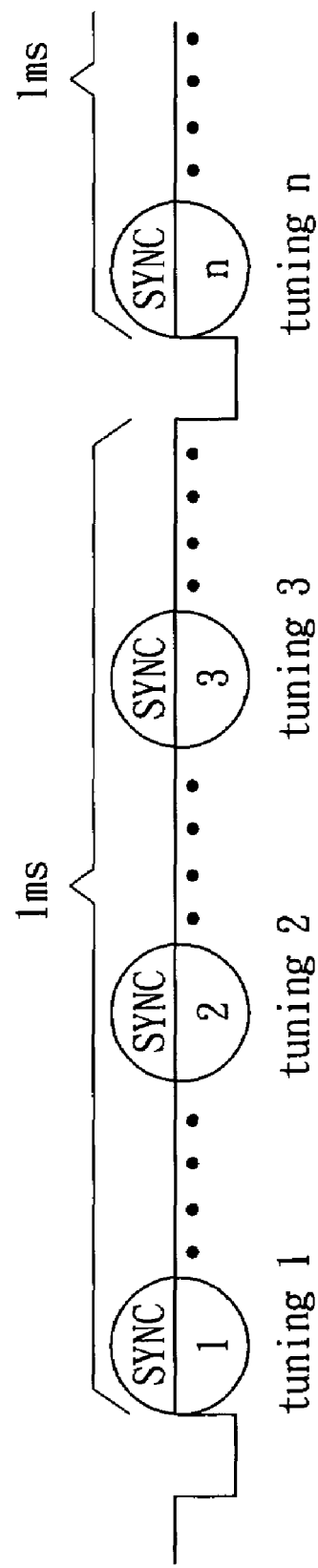
FIG. 2 is a schematic diagram depicting an adjustment applying the auto-adjusting high accuracy oscillator of the present invention.

Please refer to FIG. 1 and FIG. 2, which are respectively a schematic diagram illustrating the functional blocks of an auto-adjusting high accuracy oscillator according to a first embodiment of the present invention and a schematic diagram depicting an adjustment applying the auto-adjusting high accuracy oscillator. As seen in FIG. 1 and FIG. 2, as soon as the frequency comparator 12 receives a SYNC signal 11, it will compare the bit rates of the inputted SYNC signal 11 and an oscillation signal being fed back from the oscillating element 14 so as to obtain an frequency error of the oscillating element 14, and then the resulting frequency error is fed to the control tuning circuit 13 for enabling the same to generate an adjusting signal in response thereto automatically, and then the adjusting signal is sent to the oscillating element 14 for adjusting oscillation signal of the oscillating element 14 accordingly, and thereafter, the adjusted oscillation signal is fed back to the frequency comparator 12 so as to form a feedback loop until the oscillation signal of the oscillating element 14 can match the SYNC signal 11 to the extend that the error is below is 1%.

The auto-adjusting oscillator of FIG. 1 comprises a frequency comparator 12, a control tuning circuit 13 and an oscillating element 14, which is used to match an internal clock to a data stream inputted from the USB interface by approaching the difference between two to be within 1% error rate.

Figure 3:
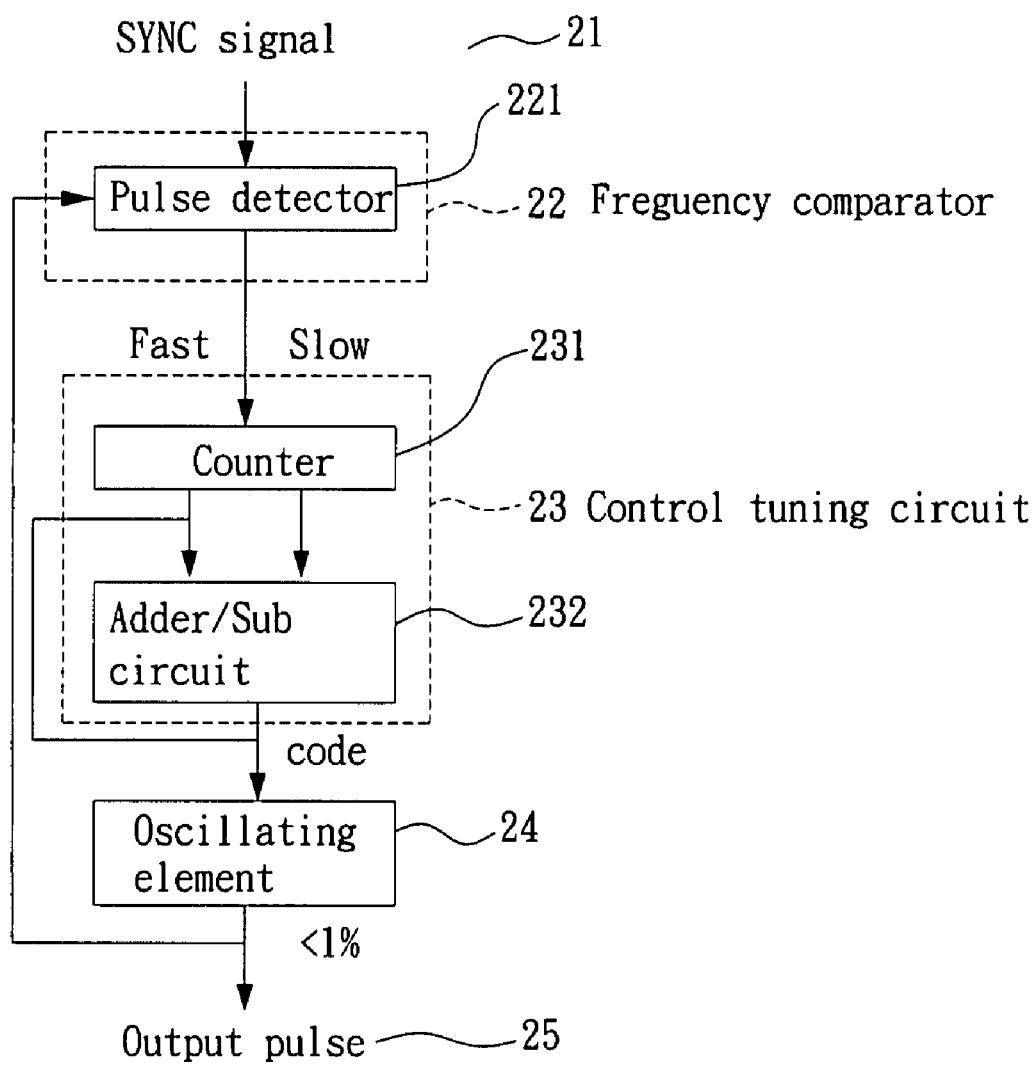
FIG. 3 is a schematic diagram illustrating the functional blocks of an auto-adjusting high accuracy oscillator according to a second embodiment of the present invention.

Please refer to FIG. 3, which is a schematic diagram illustrating the functional blocks of an auto-adjusting high accuracy oscillator according to a second embodiment of the present invention. The auto-adjusting high accuracy oscillator of FIG. 3 comprises: a frequency comparator 22, further comprising a pulse detector 221 for detecting and comparing a SYNC signal 21 obtained from a USB host with an oscillation signal obtain from a device so as to obtain a frequency difference between the two; a control tuning circuit 23, further comprising a counter 231 and an adder/sub circuit 232, for receiving the frequency difference received form the frequency comparator and using the same as an adjusting reference; and an oscillating element 24; a variation is obtained by the counting of the counter while transmitting the variation and the adjusting reference to the adder/sub circuit 232 to be encoded thereby into a digital code so as to enable the oscillating element 24 to perform a frequency up/down operation according to the digital code, and thus enable the frequency of the oscillation signal to approach that of the SYNC signal 21 successively. Moreover, the frequency-adjusting method of the oscillating element 24 is defined by the control tuning circuit 23 that the half of the frequency difference between the SYNC signal and the oscillating signal is employed as the amount of frequency to be adjusted in each feedback, e.g. the first adjustment is (1/2)×(frequency difference), and the second adjustment is (1/2)×(1/2)×(frequency difference), and so on. The aforesaid frequency-adjusting method is referred as successive-approximation method, which is capable of approaching the difference between two to be within 1% error rate, and being adapted for any specifications of USB protocol.

Figure 4:
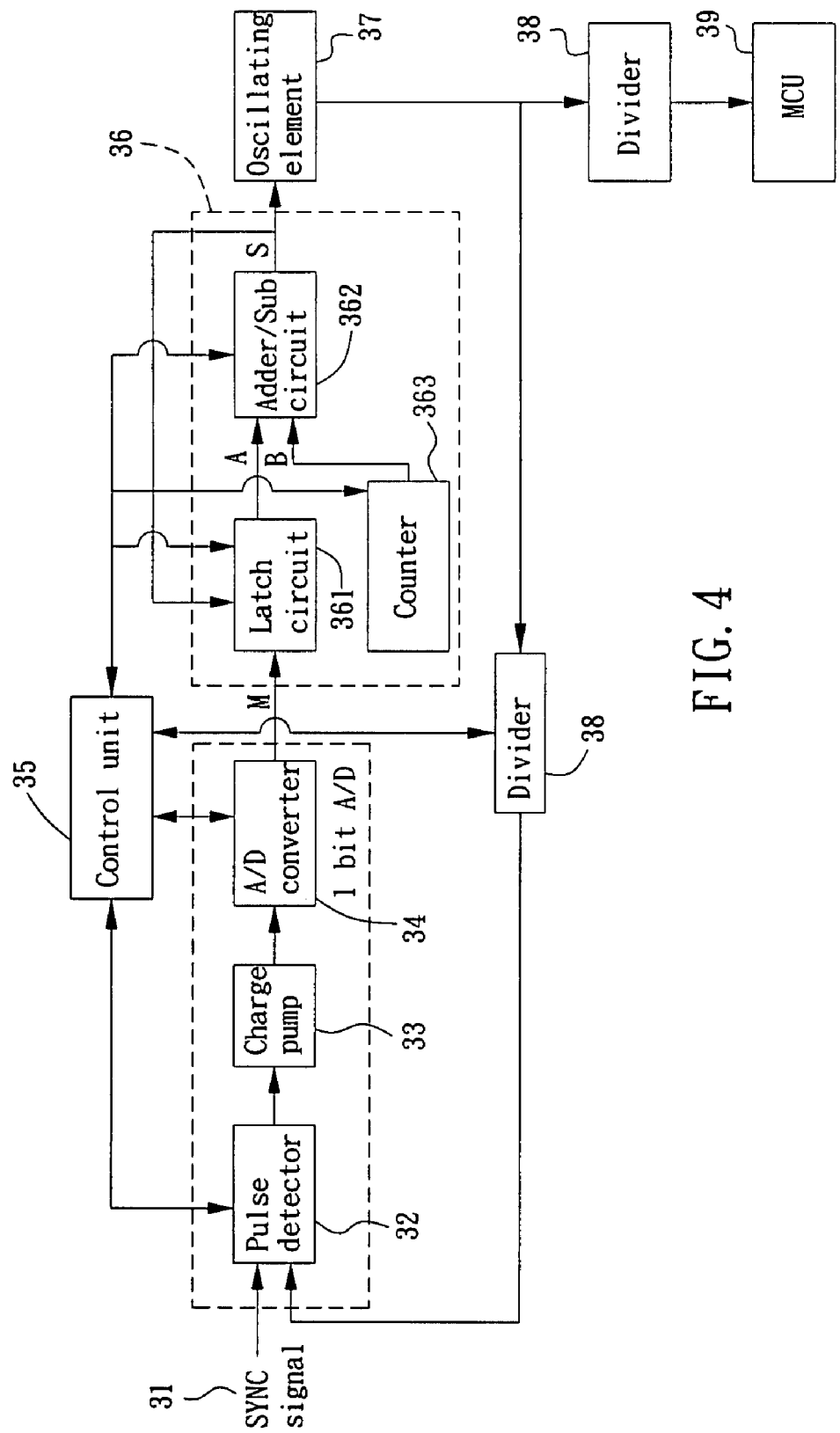
FIG. 4 is a schematic diagram illustrating the functional blocks of an auto-adjusting high accuracy oscillator according to a third embodiment of the present invention.

Please refer to FIG. 4, which is a schematic diagram illustrating the functional blocks of an auto-adjusting high accuracy oscillator according to a third embodiment of the present invention. In FIG. 4, the auto-adjusting oscillator is activated as soon as a packet of a SYNC signal 31 inputted from the data input end is received thereby, in which a pulse detector 32 is used to compare the SYNC signal 31 and a feedback oscillation signal generated by an oscillating element 37 so as to identify a time error ($\Delta T$) of time domain between the two, and then the time error ($\Delta T$) is being converted into a voltage error ($\Delta V$) by a charge pump 33, and then the voltage error ($\Delta V$) is compared with a reference voltage generated by a bandgap reference circuit at an analog-digital converter 34 for enabling the same to generate an M signal according to be used by the control tuning circuit 36 as an adjusting reference.

As soon as the generating of the M signal, a control unit 35 is enabled to inform the control tuning circuit 36. As the control tuning circuit 36 is informed of the M signal, a latch circuit 361 is enabled to perform a code locking operation for defining an A-code in response to the M signal and a counter 363 will also start counting for defining a B-code basing on the counting, and then the A-code and the B-code are transmitted to the adder/sub circuit 362 for enabling the same to generate an S-code being used to control the oscillating element 37. Preferably, the S-code must satisfy the frequency resolution of the oscillating element 37 and the oscillation frequency range of the oscillating element 37.

Moreover, the initial change of oscillation frequency should fulfill the specification of USB protocol with the tolerance of 5%, otherwise, the data transmission can be interrupted or mistaken. The oscillation frequency of the oscillating element 37 is adjust in response to the S-code corresponding to the control tuning circuit 36, that is, the oscillating element 37 will change its oscillation frequency each time when it receive an S-code so as to enable the changed oscillation frequency to approach the SYNC signal successively until the error rate is lower than 1%. It is noted that initial time of frequency change is the time that a packet of SYNC signal is received by the auto-adjusting oscillator of FIG. 4.

Furthermore, the interactive operations between each functional blocks of FIG. 4 is controlled by the control unit 35 for controlling the adjustment of pulses of the control tuning circuit 36, the timing of capturing the M signal, the timing to activate an auto-adjusting operation, the frequency dividing operation of a divider 38, the charging/discharging of the charge pump 33, and the recovery time, so as to ensure data to be transmitted accurately and then to be sent to the micro control unit 39.

Figure 5:
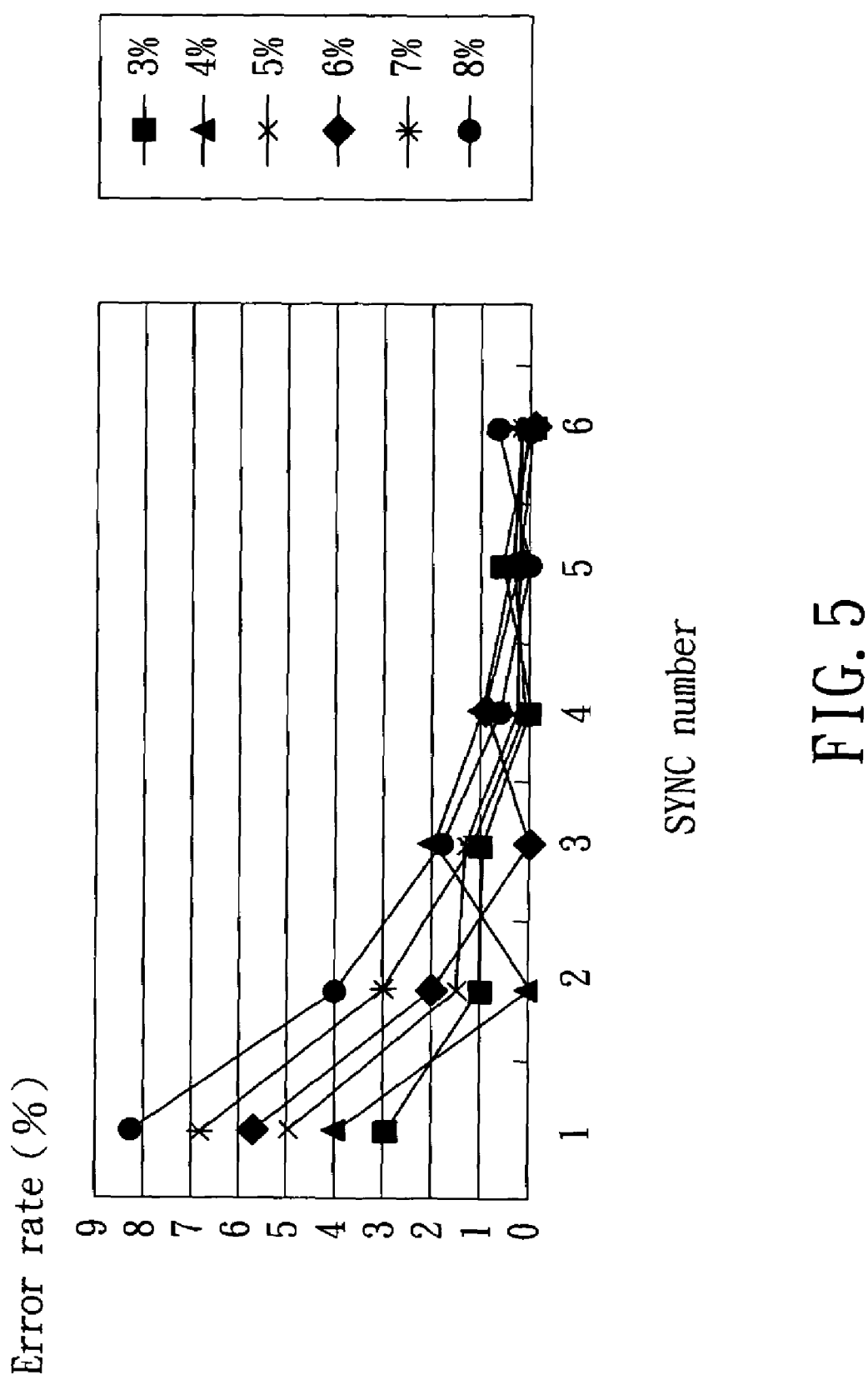
FIG. 5 is a profile depicting the relation between error and SYN number according to the present invention.
Figure 6:
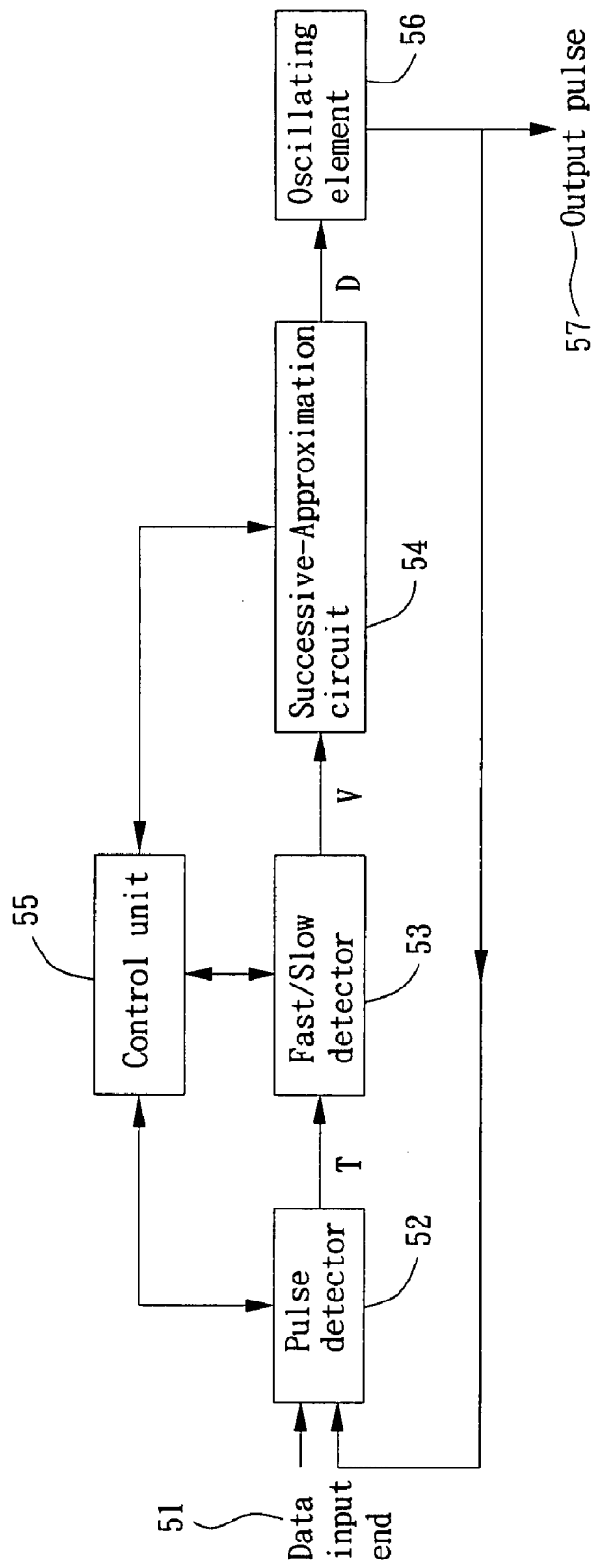
FIG. 6 is a schematic diagram illustrating the functional blocks of an auto-adjusting high accuracy oscillator according to a fourth embodiment of the present invention.

Please refer to FIG. 5, which is a profile depicting the relation between error and SYN number according to the present invention. The X axis is used for representing the number of the SYNC signal received and the Y axis is used to represent the error rate (%) compared between an adjusted oscillation frequency and the SYNC signal. As each receiving of a packet of SYNC signal, 4 bits of the packet (1 bit rate=1.5 MHz=666.67 ns) is fetched while each tuning is based on a basic unit of 2 bits, i.e. the SYNC number is increased by every 2 bits. As seen in FIG. 6, there are six data lines respectively representing initial error rate of 3%, 4%, 5%, 6%, 7%, and 8% that each is going to be reduced to under 1% after being tuned by 6 times, i.e. after the SYNC number is increased to be six.

As a packet of SYNC signal is received by an auto-adjusting oscillator through the data input end, it can fetch four complete 1.5 MHz bit rate to be used for activating the control tuning circuit to adjust the oscillation frequency rapidly and accordingly. Sine only the SYNC signal transmitted from the data input end is required as reference that it do not require the whole data stream to be transmitted form the data input end, and also it do not require high pulse frequency for counting, the auto-adjusting oscillator will consume comparably less power and cause less error and thus there will be no frequency drift after being synchronized by the same. Because of an adjustment is performed as soon as a packet of SYNC signal is received, the auto-adjusting oscillator is stable and is suitable to be applied in application of USB 1.1 or USB 2.0 specifications, and so on.

Please refer to FIG. 6, is a schematic diagram illustrating the functional blocks of an auto-adjusting high accuracy oscillator according to a fourth embodiment of the present invention. The auto-adjusting high accuracy oscillator of FIG. 6 comprises a data input end 51, a pulse detector 52, a fast/slow detector 53, a successive-approximation circuit 54, a control unit 55, an oscillating element 56 and an output pulse end 57. However, the configuration of the auto-adjusting high accuracy oscillator of the present invention is not limited by the foregoing structure shown in FIG. 6. There are other configurations as illustrated in FIG. 7A to FIG. 7C, just to mention a few.

Please refer to FIG. 7A, which is a schematic diagram illustrating the functional blocks of an auto-adjusting high accuracy oscillator according to a fifth embodiment of the present invention. The auto-adjusting high accuracy oscillator of FIG. 7A comprises a pulse detector 61, a charge pump 62, a multi-bits analog/digital converter 63 and a digitally controlled oscillator 64. The digitally controlled oscillator 64 is equipped with temperature compensating ability so that the output current and voltage thereof are free from the influence of temperature change and thus each can be a stable value, that is, the oscillation frequency of the digitally controlled oscillator 64 is not subject to the influence of temperature change. The auto-adjusting high accuracy oscillator of FIG. 7A employs a method of direct convert, that is, the time error ($\Delta T$) of the pulse detector 61 is converted into a corresponding voltage error ($\Delta V$) and is further coded into a digital code by the analog/digital converter 63 while the digital code is used to control the adjusting of the digitally controlled oscillator 64. By the use of the aforesaid direct converter, the error rate can be reduced to below 1% by just one adjusting of oscillation frequency with respect to one analysis of SYNC signal. However, the circuit of that shown in FIG. 7 is comparatively harder to design sine it will require much precise matching between functional blocks thereof.

Please refer to FIG. 7B, which is a schematic diagram illustrating the functional blocks of an auto-adjusting high accuracy oscillator according to a sixth embodiment of the present invention. The auto-adjusting high accuracy oscillator of FIG. 7B comprises a pulse detector 71, a charge pump 72, a one-bit analog/digital converter 73, a successive-approximation circuit 74 and a digitally controlled oscillator 75. The difference between those shown in FIG. 7A and FIG. 7B is that the successive-approximation circuit 74 is added in the circuit so that the function of the multi-bits analog/digital converter 63 of FIG. 7A can be replace by the cooperation of the one-bit analog/digital converter 73 and the successive-approximation circuit 74. Although the adjusting efficiency of the oscillator of FIG. 7B is slower than that shown in FIG. 7A, the circuit design of the oscillator of FIG. 7 is comparably easier to be achieved.

Please refer to FIG. 7C, which is a schematic diagram illustrating the functional blocks of an auto-adjusting high accuracy oscillator according to a seventh embodiment of the present invention. The auto-adjusting high accuracy oscillator of FIG. 7C comprises a pulse detector 81, a time-to-digital converter 82, a successive-approximation circuit 83, and a digital controlled oscillator 84. The difference between those shown in FIG. 7B and FIG. 7C is that the function provided by the cooperation of the charge pump 72 and the one-bit analog/digital converter 73 is completely replaced by the time-to-digital converter 82.

From the above description, the present can provide an auto-adjusting high accuracy oscillator for an universal-serial-bus (USB) interface that is capable of matching an internal clock to a data stream inputted from the USB interface by approaching the difference between two to be within 1% error rate, whereas the auto-adjusting oscillator is an internal non-crystal oscillator so that it is a compact and cost-saving device with auto-adjusting mechanism capable of being adapted for any specifications of USB protocol, such as USB 1.1 and USB 2.0, etc. In addition, the present can provide also provide an auto-adjusting high accuracy oscillator with internal feedback circuit for detecting and calibrating oscillating frequency, in which a detection circuit is used for automatically detecting the frequency difference between an USB signal and an oscillating frequency generated from an oscillator while calibrating and approaching the oscillating frequency to be within 1% error rate of the USB signal by a means of successive-approximation.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. An auto-adjusting high accuracy oscillator, comprising:
- a frequency comparator, for comparing a synchronization signal obtained from a USB host with an oscillation signal obtain from a device so as to obtain a frequency difference between the two;
- a control tuning circuit, further comprising a counter and an adder/sub circuit, for receiving the frequency difference received form the frequency comparator and using the same as an adjusting reference; and
- an oscillating element;
- wherein, a variation is obtained by the counting of the counter while transmitting the variation and the adjusting reference to the adder/sub circuit to be encoded thereby into a digital code so as to enable the oscillating element to perform a frequency up/down operation according to the digital code, and thus enable the frequency of the oscillation signal to approach that of the synchronization signal successively.

2. The oscillator of claim 1, wherein the frequency comparator further comprises a pulse detector.

3. The oscillator of claim 1, wherein the oscillating element is a digitally controlled oscillator.

4. The oscillator of claim 1, wherein the interactive operations of the frequency comparator and the control tuning circuit are controlled by a control unit for controlling the adjustment of pulses of the control tuning circuit, the timing of capturing electric signals, the timing to activate an auto-adjusting operation, the frequency dividing operation of a divider, the charging/discharging of a charge pump, and the recovery time so as to ensure data to be transmitted accurately.

* * * * *